(12) United States Patent
Boettcher et al.

(10) Patent No.: US 8,490,067 B2
(45) Date of Patent: Jul. 16, 2013

(54) GRAPHICAL PROGRAM CODE COVERAGE

(75) Inventors: Jeffrey R. Boettcher, Austin, TX (US); Robert E. Dye, Austin, TX (US); Steven W. Rogers, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1222 days.

(21) Appl. No.: 12/125,721

(22) Filed: May 22, 2008

(65) Prior Publication Data
US 2009/0293044 A1 Nov. 26, 2009

(51) Int. Cl.
*G06F 9/44* (2006.01)

(52) U.S. Cl.
USPC ........... 717/130; 717/124; 717/127; 717/128; 717/131; 717/133

(58) Field of Classification Search
USPC ........................................................ 717/130
See application file for complete search history.

(56) References Cited

U.S. PATENT DOCUMENTS

| | | | | |
|---|---|---|---|---|
| 5,758,061 | A * | 5/1998 | Plum .............................. | 714/35 |
| 6,192,511 | B1 | 2/2001 | Johnston et al. | |
| 6,212,675 | B1 * | 4/2001 | Johnston et al. ............. | 717/107 |
| 6,618,839 | B1 * | 9/2003 | Beardslee et al. ........... | 716/102 |
| 7,239,993 | B2 * | 7/2007 | Roesner et al. ................ | 703/13 |
| 7,313,449 | B1 * | 12/2007 | Ciolfi et al. ...................... | 700/21 |
| 7,530,057 | B2 * | 5/2009 | Babcock ....................... | 717/129 |
| 7,720,662 | B1 * | 5/2010 | Aldrich .......................... | 703/13 |
| 7,830,386 | B1 * | 11/2010 | Hahn ............................ | 345/501 |
| 2003/0188301 | A1 * | 10/2003 | Bates et al. ................... | 717/158 |
| 2004/0010734 | A1 * | 1/2004 | Ghercioiu et al. ............. | 714/38 |
| 2004/0199897 | A1 * | 10/2004 | Ghercioiu et al. ............ | 717/101 |
| 2005/0049842 | A1 * | 3/2005 | Roesner et al. ................ | 703/14 |
| 2005/0160405 | A1 * | 7/2005 | Lunia et al. .................... | 717/124 |
| 2005/0289274 | A1 * | 12/2005 | Ghercioiu et al. ............ | 710/303 |
| 2007/0277151 | A1 * | 11/2007 | Brunel et al. ................. | 717/113 |
| 2007/0288885 | A1 * | 12/2007 | Brunel et al. ................. | 717/104 |
| 2008/0127099 | A1 * | 5/2008 | Ur et al. ........................ | 717/125 |

OTHER PUBLICATIONS

Walker, Mark; "Measuring Test Completeness Using the Code Coverage Tool"; MATLAB Digest; The MathWorks; Mar. 2007; retrieved from Internet: http://www.mathworks.com/company/newsletters/digest/2007/mar/codecoverage.html; 4 pages.

"Model Coverage"; T-Vec Wiki; May 19, 2007; retrieved from Internet: https://www.t-vec.com/wiki/index.php/Model_Coverage;.

\* cited by examiner

*Primary Examiner* — Wei Zhen
*Assistant Examiner* — Matthew Brophy
(74) *Attorney, Agent, or Firm* — Meyertons Hood Kivlin Kowert & Goetzel, P.C.; Jeffrey C. Hood; Mark S. Williams (57) ABSTRACT

System and method for analyzing a graphical program. A graphical program is provided that includes a plurality of interconnected nodes that visually indicate functionality of the program. The graphical program includes a plurality of block diagrams arranged in a hierarchical manner, including a top-level block diagram and one or more sub-block diagrams, where each block diagram includes a respective subset of the plurality of interconnected nodes. At least one of the block diagrams includes a node that includes at least one of the sub-block diagrams. When a block diagram executes, all the respective nodes of the block diagram execute. Each node in the plurality of interconnected nodes is configured to provide graphical code coverage information when executed. The graphical program is executed, thereby generating graphical code coverage information for the graphical program indicating which nodes executed, which is then stored.

27 Claims, 7 Drawing Sheets

| VI Name | Coverage Percentage |
|---|---|
| test_code_cov.vi | 47.37% |
|     Diagram 1 | |
|     Diagram 2 | |

Figure 7

| VI Name | Coverage Percentage |
|---|---|
| top_level.vi | 56.12% |
|     Diagram 1 | |
|     Diagram 2 | |
| sub_1.vi | 87.56% |
|     Diagram 1 | |
| sub_2.vi | 35.87% |
|     Diagram 1 | |
|     Diagram 2 | |
|     Diagram 3 | |
| sub_3.vi | 100% |
| sub_4.vi | 12.83% |
|     Diagram 1 | |
|     Diagram 2 | |
|     Diagram 3 | |
|     Diagram 4 | |
|     Diagram 5 | |

Figure 8

GRAPHICAL PROGRAM CODE COVERAGE

FIELD OF THE INVENTION

The present invention relates to the field of graphical programming, and more particularly to a system and method for determining code coverage in a graphical program.

DESCRIPTION OF THE RELATED ART

Graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

U.S. Pat. Nos. 4,901,221; 4,914,568; 5,291,587; 5,301,301; and 5,301,336; among others, to Kodosky et al disclose a graphical programming environment which enables a user to easily and intuitively create a graphical program or graphical diagram, also referred to as a block diagram. A user may assemble a graphical program by selecting various nodes, e.g., icons such as function nodes, terminals nodes, structure nodes, etc., which represent desired functionality, and then connecting the nodes together to create the program. The nodes may be connected by lines representing data flow between the nodes, control flow, or execution flow. Thus the block diagram may include a plurality of interconnected icons such that the diagram created graphically displays a procedure or method for accomplishing a certain result, such as manipulating one or more input variables and/or producing one or more output variables, i.e., a plurality of interconnected nodes that visually indicate the functionality of the program. In response to the user constructing a diagram or graphical program, e.g., using a block diagram editor, data structures and/or program instructions may be automatically constructed which characterize an execution procedure that corresponds to the displayed procedure. The graphical program may be compiled or interpreted by a computer. In other approaches, the graphical program may be created programmatically or automatically based on other entities, e.g., based on a program specification or another program.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Code coverage analysis is used in software testing, and refers generally to the determination of the degree to which source code of a program has been tested, e.g., how thoroughly the program has been exercised by testing, and may be directed to various coverage criteria, such as function coverage, statement coverage, condition coverage, path coverage, and entry/exit coverage, among others. Code coverage analysis has traditionally been used with respect to text-based programs, e.g., in C, C++, FORTRAN, etc., although some graphical programming systems facilitate code coverage analysis with respect to graphical program elements. However, prior art graphical code coverage analysis is limited by certain assumptions regarding program structure and elements, and thus lacks functionality, particularly regarding block diagram-based graphical programming systems, such as LabVIEW.

SUMMARY OF THE INVENTION

Various embodiments of a system and method for performing graphical program code coverage analysis are presented below.

A graphical program may be provided. The graphical program preferably includes a plurality of interconnected nodes that visually indicate functionality of the graphical program. The graphical program may include a block diagram and may also include a user interface portion or front panel portion. Where the graphical program includes a user interface portion, the user may optionally assemble the user interface on the display. As one example, the user may use the LabVIEW graphical programming development environment to create the graphical program. The graphical program may implement a measurement function that is desired to be performed, although in other embodiments, the graphical program may implement any functionality desired.

Each node in the plurality of interconnected nodes may be configured to provide graphical code coverage information when executed. The graphical program may include a plurality of block diagrams arranged in a hierarchical manner, including a top-level block diagram and one or more sub-block diagrams, where each block diagram includes a respective subset of the plurality of interconnected nodes. In preferred embodiments, the respective pluralities of nodes do not overlap, i.e., the respective pluralities of nodes are disjoint subsets of the plurality of interconnected nodes.

At least one of the block diagrams may include a node that includes at least one of the sub-block diagrams. In other words, one or more nodes in the graphical program may contain, or represent, call, or reference, one or more sub-block diagrams. It should be noted that in preferred embodiments, when a block diagram executes, all the respective nodes of the block diagram execute. However, not all sub-block diagrams (and thus, nodes) that belong to a block diagram may execute. In other words, while a node that includes one or more sub-block diagrams will itself be executed when the block diagram containing it executes, one or more of its sub-block diagrams may not execute. Note that as used herein, a block diagram's nodes are considered to be those at the top-level of that diagram, and while some of these nodes may have sub-block diagrams, the nodes in these sub-block diagrams (that are hierarchically under the block diagram) are not considered to be nodes of that block diagram.

It should be noted that there is more than one way for nodes or block diagrams to be hierarchically under a node. For example, one type of hierarchy, which may be referred to as a structural hierarchy, results from structure nodes, e.g., case structure nodes, sequence structure nodes, etc., that contain other nodes or block diagrams, which themselves may include other structure nodes, and so on. Note that this type of hierarchy extends or "drills down" through structure nodes, but not through sub-routine calls.

Another type of hierarchy is that resulting from sub-routine calls, e.g., where a node in a diagram calls or references a sub-routine, which itself may include one or more block diagrams, and which may include further sub-routine calls, and so forth. This hierarchy may be referred to as a calling hierarchy. Note that as used herein, a routine or sub-routine (e.g., an independently executable subprogram) may be referred to as a "virtual instrument" (VI), and a graphical program may include one or more VIs. Subprograms or sub-routines called by or in the graphical program may be referred to as "subVIs". A node in a block diagram that includes one or more sub-block diagrams, i.e., that "calls" a subprogram that includes the one or more sub-block diagrams may be referred to as a subVI node or subVI call (or, more casually or loosely, simply a subVI). Note that while this type of hierarchy extends through sub-routine or subVI calls, node ownership may not. Thus, for example, given a (sub)VI or (sub-)routine, the nodes that belong to that VI may include all nodes in the top-level block diagram of the VI, as well as all nodes below the block diagram according to a structural hierarchy, but may not include nodes below the block diagram according to a calling hierarchy, i.e., nodes contained in or by other sub-routines. Thus, when counting nodes that belong to the VI, subVI nodes encountered when traversing downward through the structural hierarchy may be counted, but not those nodes in the subVIs called by the subVI nodes.

The graphical program may be executed, thereby generating graphical code coverage information for the graphical program indicating which nodes executed. The generated graphical code coverage information may take any of a variety of forms. For example, in one embodiment, the graphical code coverage information may be in the form of a list of the nodes in the graphical program with their flag values. In another embodiment, the graphical code coverage information may include a listing of flag values or equivalent format-ted to correspond to some a priori node list, e.g., where the values are associated with respective nodes via their position in the listing. Note that the above are meant to be exemplary only, and are not intended to limit the graphical code coverage information to any particular form, function, or appearance.

Note that in general, the graphical program may be executed with some specified set or sets of data. For example, in cases where the graphical program is being developed or debugged, data sets may be provided that are intended to thoroughly exercise the graphical program, e.g., cause invo-cation and execution of all or some specified portion of the graphical program. Of course, the data may be of any type, range, or amount, as desired, e.g., depending on the purpose of the code coverage operation or process.

The graphical code coverage information may be stored, e.g., in a memory of the computer system or a memory coupled to the computer system, e.g., over a network. As indicated above, the graphical code coverage information may be in any of a variety of forms. This information may similarly be stored in a variety of forms, e.g., in one or more files, lists, data structures, database entries, etc., as desired.

In preferred embodiments, the method may include auto-matically analyzing the generated graphical code coverage information to determine graphical code coverage analysis results, which may then be stored. In other words, the "raw" graphical code coverage information may be processed to generate various results or metrics that characterize the execution of the graphical program. For example, in one exemplary embodiment, the results may include the fraction of the plurality of nodes of the graphical program that executed in or during the executing, and/or the block dia-grams that did not execute (in or during the executing). These graphical code coverage analysis results may then be output. For example, in one embodiment, a report may be generated that includes the graphical code coverage analysis results, e.g., the fraction of nodes that executed, possibly including an indication of their respective diagrams. In some embodi-ments, at least a portion of the graphical program may be displayed, e.g., on a computer display, including graphically highlighting the block diagrams that did not execute (or, alternatively, those that did execute).

The various examples of graphical code coverage informa-tion described above are meant to be exemplary only, and other graphical code coverage information may be generated as desired. For example, the graphical code coverage infor-mation may include execution count per node, and/or execu-tion count per diagram, among others.

BRIEF DESCRIPTION OF THE DRAWINGS

A better understanding of the present invention can be obtained when the following detailed description of the pre-ferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equiva-lents and alternatives falling within the spirit and scope of the present invention as defined by the appended claims.

DETAILED DESCRIPTION OF THE INVENTION

Incorporation by Reference

The following references are hereby incorporated by ref-erence in their entirety as though fully and completely set forth herein:

U.S. Pat. No. 4,914,568 titled "Graphical System for Model-ing a Process and Associated Method," issued on Apr. 3, 1990.

U.S. Pat. No. 5,481,741 titled "Method and Apparatus for Providing Attribute Nodes in a Graphical Data Flow Envi-ronment".

U.S. Pat. No. 6,173,438 titled "Embedded Graphical Pro-gramming System" filed Aug. 18, 1997.

U.S. Pat. No. 6,219,628 titled "System and Method for Con-figuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Graphical Data Flow Program (or Graphical Data Flow Diagram)—A graphical program or diagram comprising a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input the by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Subset—in a set having N elements, the term "subset" comprises any combination of one or more of the elements, up to and including the full set of N elements. For example, a subset of a plurality of icons may be any one icon of the plurality of the icons, any combination of one or more of the icons, or all of the icons in the plurality of icons. Thus, a subset of an entity may refer to any single element of the entity as well as any portion up to and including the entirety of the entity.

Figure 1A:
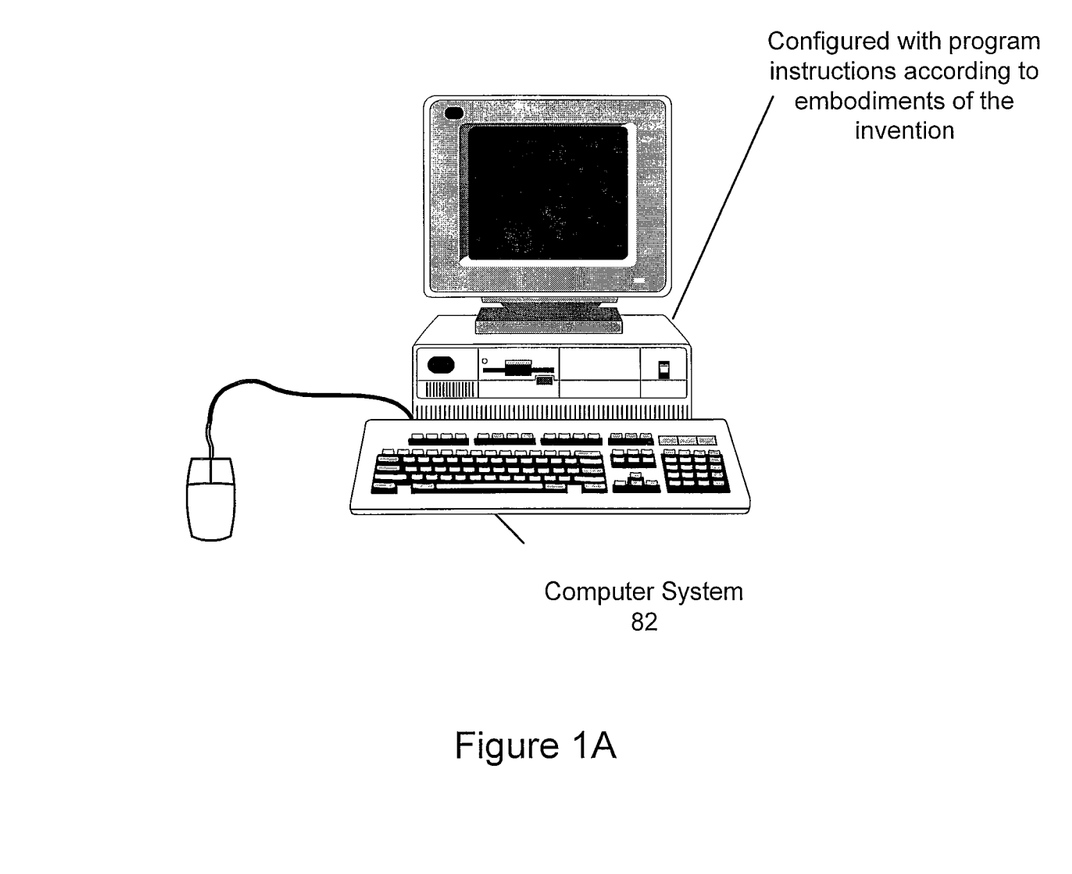
FIG. 1A illustrates a computer system operable to execute a graphical program according to an embodiment of the present invention.

FIG. 1A—Computer System

FIG. 1A illustrates a computer system 82 configured to implement embodiments of the present invention. Embodiments of a method for performing graphical program code coverage analysis, i.e., code coverage analysis of a graphical program, are described below.

As shown in FIG. 1A, the computer system 82 may include a display device operable to display the graphical program as the graphical program is created and/or executed. The display device may also be operable to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs, and/or a graphical program analysis application. In some embodiments, the development environment may include the analysis application. The memory medium may also store operating system software, as well as other software for operation of the computer system. Thus, embodiments of the invention may be implemented by a software program (or programs). Various embodiments further include receiving or storing instructions and/or data implemented in accordance with the foregoing description upon a carrier medium.

Figure 1B:
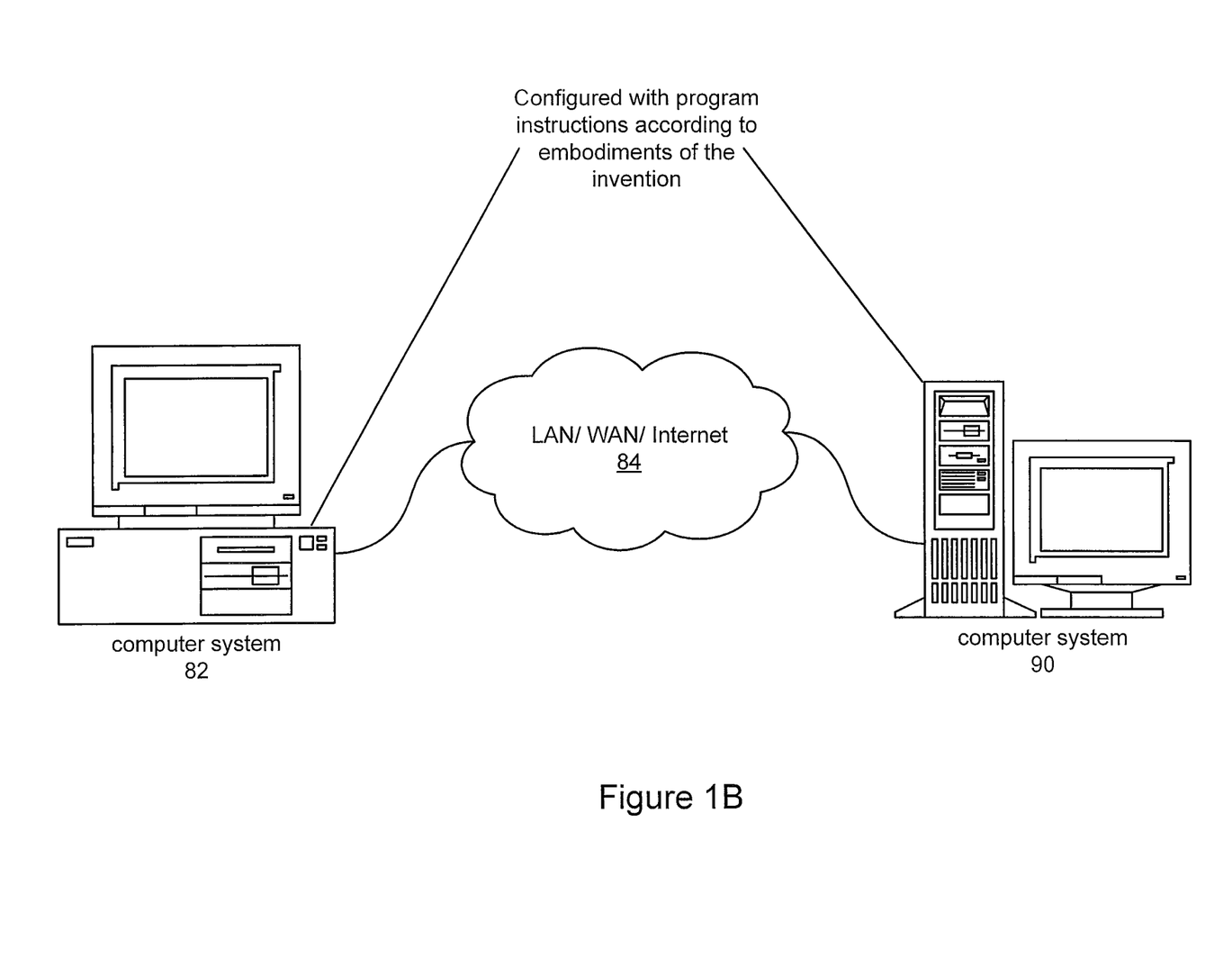
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program in a distributed fashion to implement embodiments of the present invention. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

Figure 2:
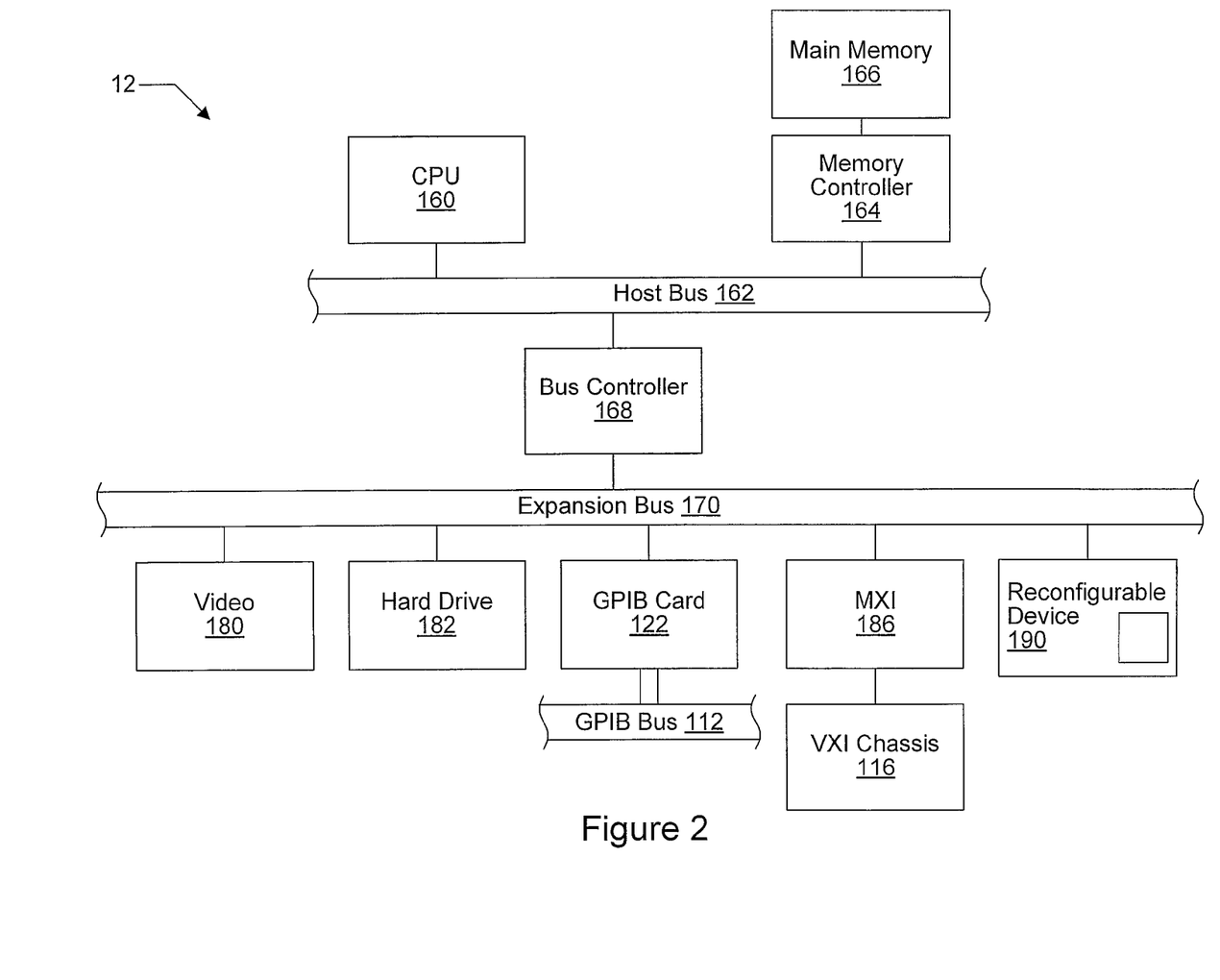
FIG. 2 is an exemplary block diagram of the computer systems of FIGS. 1A and 1B.

FIG. 2—Computer System Block Diagram

FIG. 2 is a block diagram representing one embodiment of the computer system 82 and/or 90 illustrated in FIGS. 1A and 1B. It is noted that any type of computer system configuration or architecture can be used as desired, and FIG. 2 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store programs, i.e., program instructions, implementing embodiments of the present invention, specifically, graphical program code coverage analysis, and may also store a graphical program to which the analysis is directed. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

Figure 3:
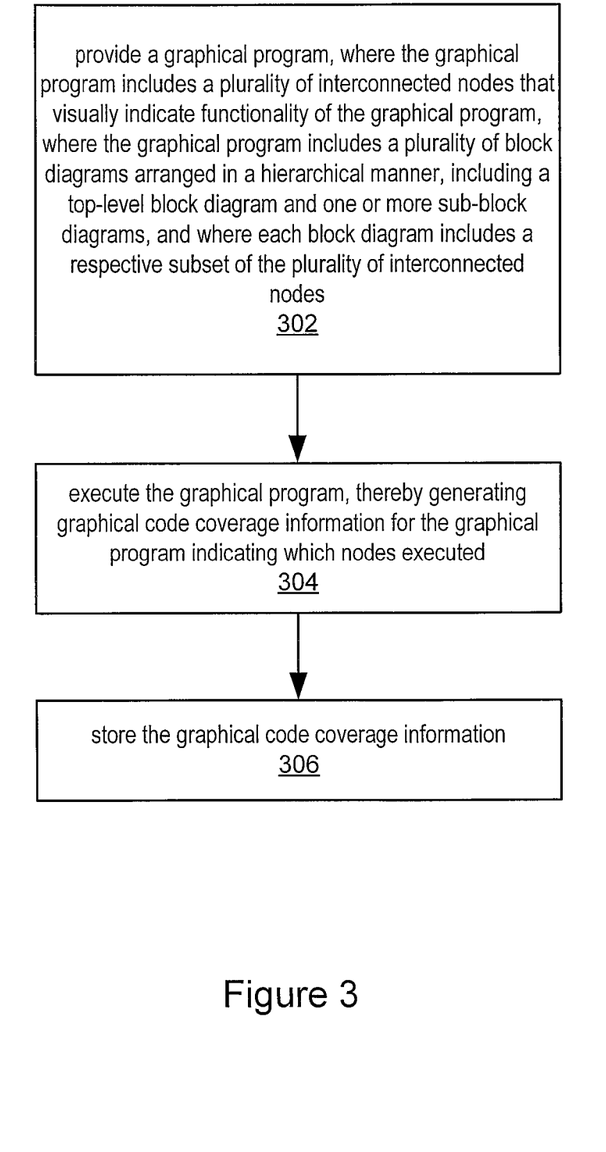
FIG. 3 is a flowchart diagram illustrating one embodiment of a method for performing graphical program code coverage analysis.

FIG. 3—Method for Performing Graphical Program Code Coverage Analysis

FIG. 3 flowcharts a method for analyzing a graphical program, specifically, for performing graphical program code coverage analysis, according to one embodiment. In various embodiments, some of the method elements shown may be performed concurrently, in a different order than shown, or may be omitted. Additional method elements may also be performed as desired. As shown, this method may operate as follows.

In 302 a graphical program may be provided, e.g., on the computer system 82 (or on a different computer system). The graphical program preferably includes a plurality of interconnected nodes that visually indicate functionality of the graphical program.

The graphical program may be received from a source coupled to the computer system 82, or may be created on the computer system 82. For example, the graphical program may be created or assembled by a user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format, although in preferred embodiments, the graphical program is or includes a graphical data flow program.

As noted above, the graphical program may include a block diagram and may also include a user interface portion or front panel portion. Where the graphical program includes a user interface portion, the user may optionally assemble the user interface on the display. As one example, the user may use the LabVIEW graphical programming development environment to create the graphical program.

In an alternate embodiment, the graphical program may be created in 302 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed, although in other embodiments, the graphical program may implement any functionality desired.

Each node in the plurality of interconnected nodes may be configured to provide graphical code coverage information when executed. The graphical program may include a plurality of block diagrams arranged in a hierarchical manner, including a top-level block diagram and one or more sub-block diagrams, where each block diagram includes a respective subset of the plurality of interconnected nodes. In preferred embodiments, the respective pluralities of nodes do not overlap, i.e., the respective pluralities of nodes are disjoint subsets of the plurality of interconnected nodes.

At least one of the block diagrams may include a node that includes at least one of the sub-block diagrams. In other words, one or more nodes in the graphical program may contain, or represent, call, or reference, one or more sub-block diagrams. It should be noted that in preferred embodiments, when a block diagram executes, all the respective nodes of the block diagram execute. However, not all sub-block diagrams (and thus, nodes) that belong to a block diagram may execute. In other words, while a node that includes one or more sub-block diagrams will itself be executed when the block diagram containing it executes, one or more of its sub-block diagrams may not execute. Note that as used herein, a block diagram's nodes are considered to be those at the top-level of that diagram, and while some of these nodes may have sub-block diagrams, the nodes in these sub-block diagrams (that are hierarchically under the block diagram) are not considered to be nodes of that block diagram.

For example, consider a case structure node that implements a case structure, sometime referred to as a switch case structure. Generally, this type of node includes a sub-block diagram for each case defined for the structure. As is well known in the programming arts, generally, only a subset of possible cases (e.g., one) are executed when the case structure executes, thus, in a graphical program, when the case structure node executes, e.g., as part of the execution of a block diagram, one or more of the sub-block diagrams corresponding to the various cases, i.e., that are hierarchically under the case structure node (and the block diagram which contains it) may not be executed. An example graphical program with nested case structure nodes is described below.

It should be noted that there is more than one way for nodes or block diagrams to be hierarchically under a node. For example, one type of hierarchy, which may be referred to as a structural hierarchy, results from structure nodes, e.g., case structure nodes, sequence structure nodes, etc., that contain other nodes or block diagrams, which themselves may include other structure nodes, and so on. Note that this type of hierarchy extends or "drills down" through structure nodes, but not through sub-routine calls.

Another type of hierarchy is that resulting from sub-routine calls, e.g., where a node in a diagram calls or references a sub-routine, which itself may include one or more block diagrams, and which may include further sub-routine calls, and so forth. This hierarchy may be referred to as a calling hierarchy. Note that as used herein, a routine or sub-routine (e.g., an independently executable subprogram) may be referred to as a "virtual instrument" (VI), and a graphical program may include one or more VIs. Subprograms or sub-routines called by or in the graphical program may be referred to as "subVIs". A node in a block diagram that includes one or more sub-block diagrams, i.e., that "calls" a subprogram that includes the one or more sub-block diagrams may be referred to as a subVI node or subVI call (or, more casually or loosely, simply a subVI). Note that while this type of hierarchy extends through sub-routine or subVI calls, node ownership may not. Thus, for example, given a (sub)VI or (sub-)routine, the nodes that belong to that VI may include all nodes in the top-level block diagram of the VI, as well as all nodes below the block diagram according to a structural hierarchy, but may not include nodes below the block diagram according to a calling hierarchy, i.e., nodes contained in or by other sub-routines. Thus, when counting nodes that belong to the VI, subVI nodes encountered when traversing downward through the structural hierarchy may be counted, but not those nodes in the subVIs called by the subVI nodes.

In 304, the graphical program may be executed, thereby generating graphical code coverage information for the graphical program indicating which nodes executed. The generated graphical code coverage information may take any of a variety of forms. For example, in one embodiment, the graphical code coverage information may be in the form of a list of the nodes in the graphical program with their flag values. In another embodiment, the graphical code coverage information may include a listing of flag values or equivalent formatted to correspond to some a priori node list, e.g., where the values are associated with respective nodes via their position in the listing. Note that the above are meant to be exemplary only, and are not intended to limit the graphical code coverage information to any particular form, function, or appearance.

Note that in general, the graphical program may be executed with some specified set or sets of data. For example, in cases where the graphical program is being developed or debugged, data sets may be provided that are intended to thoroughly exercise the graphical program, e.g., cause invocation and execution of all or some specified portion of the graphical program. Of course, the data may be of any type, range, or amount, as desired, e.g., depending on the purpose of the code coverage operation or process.

In 306, the graphical code coverage information may be stored, e.g., in a memory of the computer system or a memory coupled to the computer system, e.g., over a network. As indicated above in 304, the graphical code coverage information may be in any of a variety of forms. This information may similarly be stored in a variety of forms, e.g., in one or more files, lists, data structures, database entries, etc., as desired.

In preferred embodiments, the method may include automatically analyzing the generated graphical code coverage information to determine graphical code coverage analysis results, which may then be stored. In other words, the "raw" graphical code coverage information may be processed to generate various results or metrics that characterize the execution of the graphical program. For example, in one exemplary embodiment, the results may include the fraction of the plurality of nodes of the graphical program that executed in or during the executing, and/or the block diagrams that did not execute (in or during the executing). These graphical code coverage analysis results may then be output. For example, in one embodiment, a report may be generated that includes the graphical code coverage analysis results, e.g., the fraction of nodes that executed, possibly including an indication of their respective diagrams. In some embodiments, at least a portion of the graphical program may be displayed, e.g., on a computer display, including graphically highlighting the block diagrams that did not execute (or, alternatively, those that did execute).

Note, however, that the above is meant to be exemplary only, and that other types of analysis results are contemplated. For example, in one embodiment, the method may include automatically analyzing the generated graphical code coverage information to determine graphical code coverage analysis results, including one or more of: sub-routines (i.e., VIs or subVIs) for which graphical code coverage information was generated; for a selected sub-routine for which graphical code coverage information was generated, fraction of the plurality of nodes of the selected sub-routine and all block diagrams hierarchically under the selected sub-routine that executed in said executing, excluding block diagrams contained within other sub-routines; block diagrams hierarchically under the selected sub-routine that did not execute in said executing; nodes in the graphical program that executed; or nodes in the graphical program that did not execute, among others.

As another example, the graphical code coverage analysis results may include one or more of: block diagrams for which graphical code coverage information was generated; for a selected block diagram for which graphical code coverage information was generated, the fraction of the plurality of nodes of the selected block diagram and all block diagrams hierarchically under the selected block diagram that executed; block diagrams hierarchically under the selected block diagram that did not execute (in the executing); nodes in the graphical program that executed; and/or nodes in the graphical program that did not execute, among others.

As noted above, the graphical code coverage analysis results may then be stored. Examples of graphical code coverage analysis results are described below with respect to FIGS. 7 and 8.

The graphical program may be written in a graphical programming language where each node is inherently configurable to provide graphical code coverage information. In other words, the user may not be required to add additional program code to the nodes, or otherwise manually "instrument" the nodes to provide or collect the graphical code coverage information. For example, in one embodiment, each node in the plurality of interconnected nodes may be configured with a flag specifying that the node is to be marked as covered when executed, and a flag marking the node as covered, where the flag marking the node as covered may be set when the flag specifying that the node is to be marked as covered when executed is set, and the node is executed. Thus, a first flag may determine whether the second flag is to be set during execution, thus facilitating node-level control over the graphical code coverage functionality. However, note that in other embodiments, only the second flag (i.e., the flag marking the node as covered) may be included, where the code coverage process may not be disable-able at the node level.

In embodiments that utilize both flags, the executing may include: for each node that executes, the node checking its flag specifying that the node is to be marked as covered when executed, and the node setting its flag marking the node as covered if the flag specifying that the node is to be marked as covered when executed is set. Said another way, if upon execution, the node's flag specifying that the node is to be marked as covered when executed is set, the node may set its flag marking the node as covered, thus indicating that the node executed. In some embodiments, for each node that executes, the node may also clear its flag specifying that the node is to be marked as covered when executed. Thus, in subsequent executions of the node, the node may avoid unnecessarily setting the flag marking the node as covered again, since it is already set.

As indicated above, the use of an enabling flag for each node, specifically, the flag specifying that the node is to be marked as covered when executed, may facilitate controlling when and where the graphical code coverage information may be provided. Thus, in some embodiments, the graphical program may be configured to provide the desired graphical code coverage information. More specifically, the method may include: prior to executing the graphical program, setting the flag specifying that the node is to be marked as covered when executed for each node of at least a subset of the plurality of interconnected nodes. For example, the flag specifying that the node is to be marked as covered when executed may be set for all the nodes of diagrams for which graphical code coverage information is desired. Similarly, these flags may be cleared to cease provision or collection of graphical code coverage information. In other words, in one embodiment, the method may include ceasing generation of the graphical code coverage information by clearing the flag specifying that the node is to be marked as covered when executed for each node in at least a portion of the graphical program. Thus, possibly during execution (or when execution is paused), a function may be invoked that clears the flag specifying that the node is to be marked as covered when executed for one or more nodes in the graphical program, thereby disabling the graphical code coverage functionality for those nodes.

Similarly, in some embodiments, the method may include resetting the graphical code coverage information in the graphical program, e.g., by clearing the flag marking the node as covered for each node of at least a subset of the plurality of interconnected nodes. In other words, the record of which nodes have been executed so far (i.e., the respective flags indicating execution of the node) may be cleared or reset. In various embodiments, this resetting the graphical code coverage information may include resetting the graphical code coverage information for all the nodes in a specified sub-block diagram (and in some embodiments, the nodes in all block diagrams hierarchically under the specified sub-block diagram), or for all the nodes in the graphical program.

In one embodiment, resetting the graphical code coverage information in the graphical program may further include: if the resetting is performed during generation of the graphical code coverage information, setting the flag specifying that the node is to be marked as covered when executed for each node of the at least a subset of the plurality of interconnected nodes in the graphical program. Said another way, if the execution is underway, resetting the graphical code coverage information may further include setting the flag specifying that the node is to be marked as covered when executed for each node of the at least a subset of the plurality of interconnected nodes in the graphical program. Setting this flag may thus allow subsequent graphical code coverage information to be generated. In other words, for each of at least a subset of the nodes, the graphical code coverage information may be reset, and these nodes may also be configured to resume generating the graphical code coverage information.

It should be noted that in various embodiments, configuring, resetting, enabling/disabling, etc., of the graphical program may be performed or invoked by a node in a block diagram, e.g., the top-level diagram, the development environment, and/or an external software tool, as desired. For example, in one embodiment, one or more nodes in the graphical program may operate to perform one or more of these functions, e.g., setting or resetting one or both of the flags, for specified (or all) nodes, e.g., "code coverage" function nodes may be included in the graphical program at specific locations to turn on, turn off, reset, and/or resume graphical code coverage information operations. This may facilitate sophisticated code coverage operations without requiring input from a user. Additionally, or alternatively, in some embodiments, these functions may be invoked and/or performed by the development environment, or by an external software tool or process, e.g., remotely over a network.

In a preferred embodiment, each block diagram may also include a hidden node that that represents the block diagram, and thus may be referred to as a "self-reference node", where setting its flag marking the node as covered indicates that the block diagram has been executed. Thus, executing the graphical program may include: for each block diagram that executes, the hidden node checking its flag specifying that the node is to be marked as covered when executed, and the hidden node setting its flag marking the node as covered to indicate that the block diagram has been executed if the flag specifying that the node is to be marked as covered when executed is set. In other words, this hidden node may operate in the same manner as the other nodes in the graphical program, but may correspond to, and indicate execution of, the diagram itself. The use of such a hidden node may simplify the generation of block diagram level graphical code coverage information.

As noted above, the various examples of graphical code coverage information described above are meant to be exemplary only, and other graphical code coverage information may be generated as desired. For example, the graphical code coverage information may include execution count per node, and/or execution count per diagram, among others.

FIGS. 4-8—Graphical Code Coverage Example

FIGS. 4-8 illustrate an exemplary graphical code coverage process and results, according to one embodiment. It should be noted that the examples described are exemplary only, and are not intended to limit the invention to any particular graphical program, functionality, results, or appearance.

Figure 4:
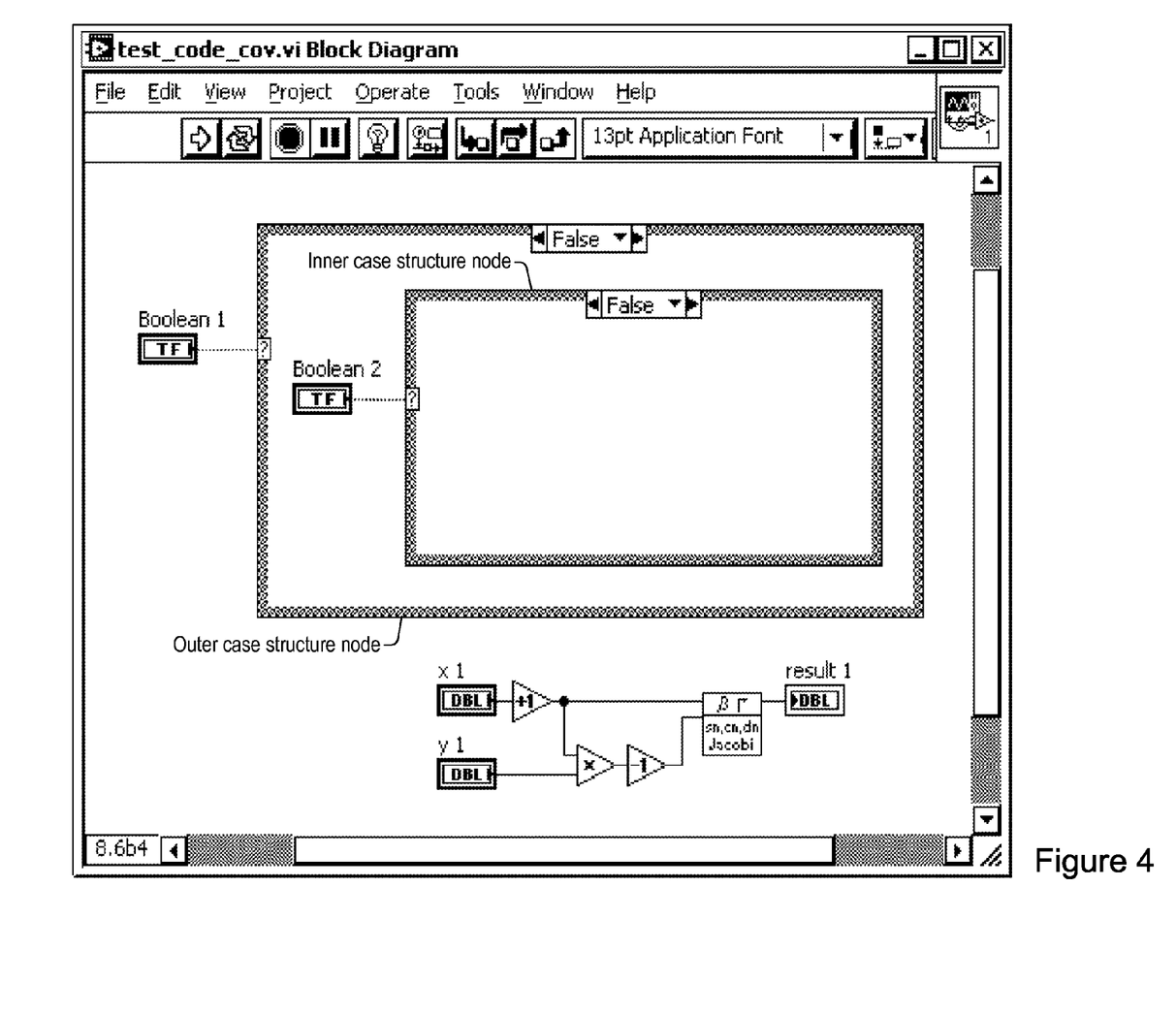
FIG. 4 illustrates a top-level block diagram of an exem-plary graphical program with a case structure, according to one embodiment.

FIG. 4 illustrates an exemplary simple graphical program with a case structure node, according to one embodiment. More specifically, FIG. 4 shows a top-level diagram with two nested case structure nodes: an outer case structure node, and an inner case structure node, so labeled. Note that each case structure node receives a Boolean input (Boolean 1 and Boolean 2, respectively, as shown) and selects and executes graphical program code (a sub-block diagram) based on the value of the Boolean. Thus, each case structure node implements a conditional execution structure, e.g., corresponding to an "if" statement in a conventional text-based programming language.

Figure 5:
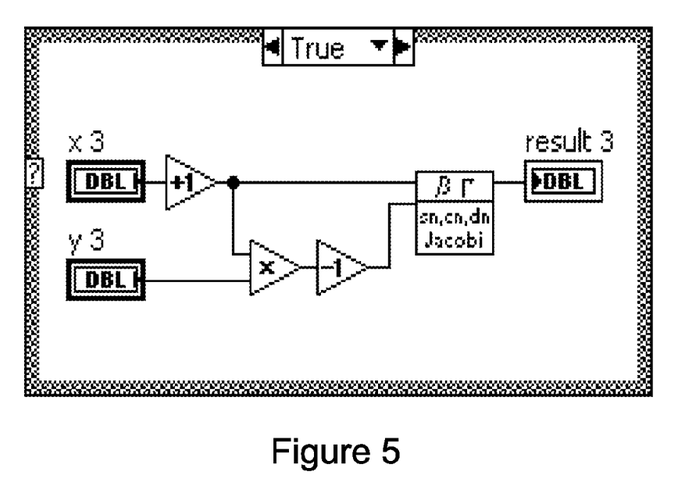
FIG. 5 illustrates an inner case frame for the graphical program of FIG. 4, according to one embodiment.
Figure 6:
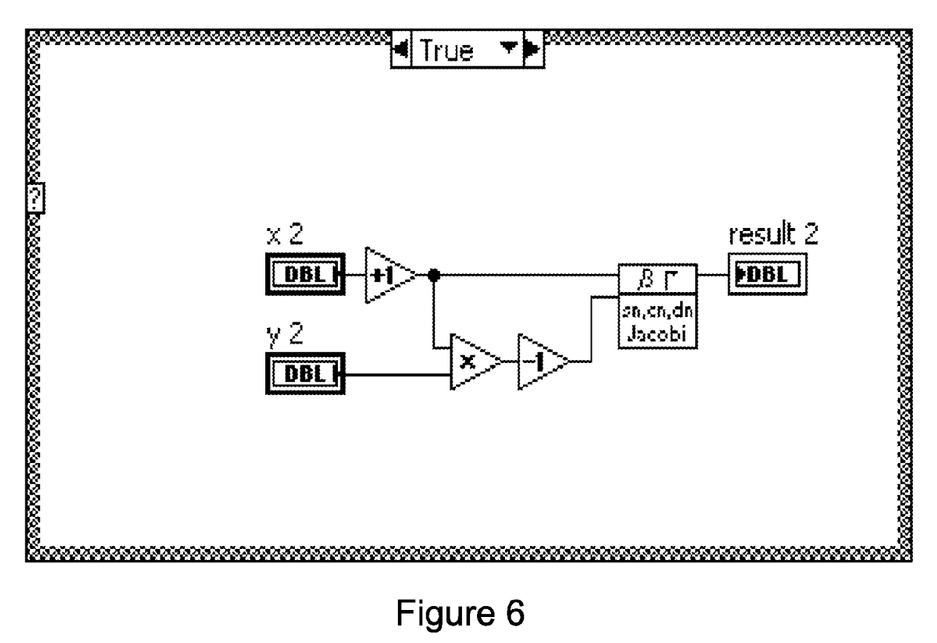
FIG. 6 illustrates an outer case frame for the graphical program of FIG. 4, according to one embodiment.

When this (top-level) block diagram executes, all nodes in the diagram execute, including the outer case structure node and any other graphical program code in the diagram, specifically, that shown below the case structure nodes. Note that in FIG. 4, each case structure node displays a respective sub-block diagram for the "False" case, which in this particular example, the sub-block diagram for the False case of the outer case structure node includes or is the inner case structure node, and the sub-block diagram for the False case of the inner case structure node is an empty or null diagram. In other words, when the conditional for each case is False, no block diagram code is executed. Not shown in FIG. 4 are the sub-block diagrams corresponding to Boolean inputs with value "True". These sub-block diagrams may be considered to be "behind" the False case sub-block diagrams, and are shown in FIGS. 5 and 6, where FIG. 5 illustrates the sub-block diagram for the inner case structure node True case, and FIG. 6 illustrates the sub-block diagram for the outer case structure node True case. It should be noted that these two sub-block diagrams, as well as the two sub-block diagrams corresponding to False cases, belong to the top-level diagram of FIG. 4, but since they are hierarchically under the top-level diagram, the nodes in these diagrams are not considered to be in the top-level diagram.

As one of skill in the art of graphical programming will readily understand, the graphical program of FIGS. 4-6 may operate as follows: When the top-level diagram executes, both the outer case structure node and the graphical program code below the case structure node execute, e.g., in parallel. If Boolean 1 (input to the outer case structure node) is True, the sub-block diagram of FIG. 6 executes, and if False, the inner case structure node (which is a single node sub-block diagram) will execute. Now, when the inner case structure node executes, if Boolean 2 is False, no block diagram code is executed, i.e., the null or empty sub-block diagram for this case "executes", and if Boolean 2 is True, the sub-block diagram of FIG. 5 will execute.

Thus, depending on the values of the two Booleans, code coverage may vary dramatically.

For example, note that the number of nodes of the entire graphical program (which includes the block diagrams of FIGS. 4-6) may be counted thusly:

9 simple mathematic primitives=9 nodes;
3 subVI calls=3 nodes;
2 case structures=2 nodes; and
5 "hidden nodes"—one for the top-level block diagram (FIG. 4), plus one for each case structure frame or case (one each for both True and False cases)=4 nodes.

Thus, there are a total of 19 nodes in this exemplary graphical program.

Figure 7:
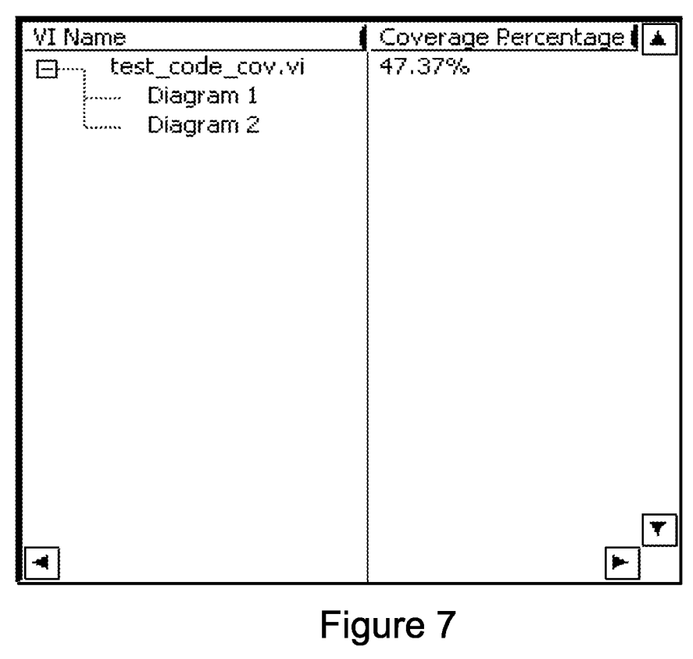
FIG. 7 illustrates an exemplary code coverage report for the graphical program of FIGS. 4-6, according to one embodi-ment.

FIG. 7 illustrates an exemplary code coverage report for the graphical program of FIGS. 4-6, according to one embodiment. As may be seen, in this simple example, the report indicates the name of the graphical program or VI, specifically, "test_code_cov.vi" and the percentage of nodes that executed (for this particular test case), in this case, i.e., when both conditionals are FALSE, 47.37%, and further lists the sub-block diagrams that did not execute, i.e., the sub-block diagrams of FIGS. 5 and 6: "Diagram 1" and "Diagram 2".

The following presents example code coverage results for the graphical program of FIGS. 4-6 under various test conditions:

Example 1

Run the VI with Boolean 1=FALSE, Boolean 2=FALSE

Nodes executed:
Top-level diagram hidden node;
Outer case structure node;
Outer case FALSE diagram hidden node;
Inner case structure node;
Inner case FALSE diagram hidden node;
3 primitive nodes in the top-level diagram;
1 subVI call in top-level diagram;
for a total of 9 nodes. Thus, in this test case, coverage is 9/19=47.37%.

Example 2

Run the VI with Boolean 1=FALSE, Boolean 2=TRUE

Nodes executed:
Top-level diagram hidden node;
Outer case structure node;
Outer case FALSE diagram hidden node;
Inner case structure node;
Inner case TRUE diagram hidden node;
3 primitive nodes in inner case TRUE diagram;
1 subVI call in inner case TRUE diagram;
3 primitive nodes in top-level diagram;
1 subVI call in top-level diagram;
for a total of 13 nodes. Thus, in this test case, coverage is 13/19=68.42%

Example 3

Run the VI with Boolean 1=TRUE

Nodes executed:
Top-level diagram hidden node;
Outer case structure;
Outer case TRUE diagram hidden node;
3 primitive calls on outer case TRUE diagram;
1 subVI call on outer case TRUE diagram;
3 primitive calls on top-level diagram;
1 subVI call on top-level diagram;
for a total of 11 nodes. Thus, in this test case, coverage is 11/19=57.89%.

The next example demonstrates using multiple test cases to fully analyze the graphical program with respect to graphical code coverage.

Example 4

Run Example 1 Followed by Example 2 Followed by Example 3

As in Example 1 above, 9/19 nodes run, 47.37%.
Example 2 adds the inner case TRUE diagram, 3 primitives, and 1 subVI. 9+5=14, 14/19=73.68%.
Example 3 adds the outer case TRUE diagram, 3 primitives, and 1 subVI. 14+5=19, 19/19=100%.

Thus, as may be seen, the example graphical program includes no "dead" or unreachable code.

Figure 8:
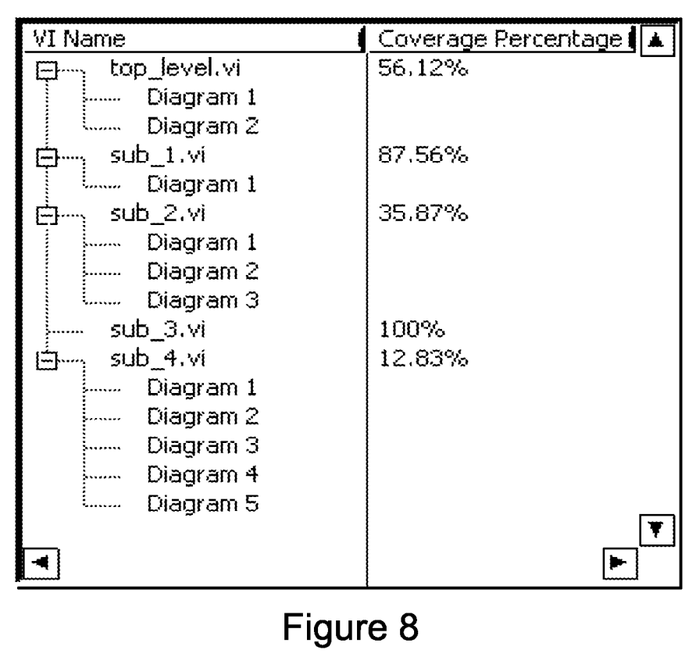
FIG. 8 illustrates an exemplary code coverage report, according to another embodiment.

FIG. 8 illustrates an exemplary code coverage report, according to another embodiment. In this example, a more complex graphical program (not shown) has been analyzed with respect to graphical code coverage, where the code coverage analysis has produce results on a "per VI" (per routine or sub-routine) basis. As may be seen, in the top-level VI or routine, 56.12% of the nodes executed, and two block diagrams (Diagram 1 and Diagram 2) belonging to that VI did not execute. Note that per the above explanation of hierarchies and VIs, these two block diagrams are not contained in sub-routines below the top level VI.

As FIG. 8 also shows, a first sub-routine, specifically, sub_1.vi, had 87.56% of its nodes execute, and one block diagram (Diagram 1) that did not. Note that the various named diagrams are local to their respective parent VIs; i.e., Diagram 1 of the top-level VI is not the same as Diagram 1 of the sub_1 VI. A second sub-routine, sub_2.vi, had 35.87% of its nodes execute, and three block diagrams (Diagram 1, Diagram 2 and Diagram 3) that did not. A third sub-routine, sub_3.vi had all its nodes execute. Finally, a fourth sub-routine, sub_4.vi had 12.83% of its nodes execute, and 5 block diagrams that did not (Diagram 1, Diagram 2, Diagram 3, Diagram 4, and Diagram 5).

Thus, various graphical code coverage reports may be generated based on analysis of the collected graphical code coverage information. Note that the example reports illustrated and discussed herein are intended to be exemplary only, and are not intended to limit the analysis, results, or reports to any particular form, function, or appearance.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-implemented method for analyzing a graphical program, the method comprising:
utilizing a computer to perform:
providing a graphical program, wherein the graphical program comprises a plurality of interconnected nodes that visually indicate functionality of the graphical program, wherein the graphical program is written in a graphical programming language in which each node has at least one associated flag for configuring the node to provide graphical code coverage information without requiring a user to add instrumentation code, wherein the graphical program comprises a plurality of block diagrams arranged in a hierarchical manner, comprising a top-level block diagram and one or more sub-block diagrams, and wherein each block diagram includes a respective subset of the plurality of interconnected nodes;
wherein at least one of the block diagrams comprises a node that includes at least one of the sub-block diagrams,
wherein when a block diagram executes, all the respective nodes of the block diagram execute, and
wherein each node in the plurality of interconnected nodes is configured to provide graphical code coverage information when executed;
executing the graphical program, wherein said executing generates graphical code coverage information for the graphical program indicating which nodes executed; and
storing the graphical code coverage information.

2. The method of claim 1, further comprising: utilizing the computer to perform:
automatically analyzing the generated graphical code coverage information to determine graphical code coverage analysis results, comprising one or more of:
fraction of the plurality of nodes of the graphical program that executed in said executing; or
block diagrams that did not execute in said executing; and
storing the graphical code coverage analysis results.

3. The method of claim 2, further comprising:
utilizing the computer to perform:
outputting the graphical code coverage analysis results, comprising one or more of:
generating a report comprising the graphical code coverage analysis results; or
displaying at least a portion of the graphical program, including graphically highlighting the block diagrams that did not execute.

4. The method of claim 1, further comprising:
utilizing the computer to perform:
automatically analyzing the generated graphical code coverage information to determine graphical code coverage analysis results, comprising one or more of:
sub-routines for which graphical code coverage information was generated;
for a selected sub-routine for which graphical code coverage information was generated, fraction of the plurality of nodes of the selected sub-routine and all block diagrams hierarchically under the selected sub-routine that executed in said executing, excluding block diagrams contained within other sub-routines; or
block diagrams hierarchically under the selected sub-routine that did not execute in said executing; and
storing the graphical code coverage analysis results.

5. The method of claim 1, further comprising:
utilizing the computer to perform:
automatically analyzing the generated graphical code coverage information to determine graphical code coverage analysis results, comprising one or more of:
block diagrams for which graphical code coverage information was generated;
for a selected block diagram for which graphical code coverage information was generated, fraction of the plurality of nodes of the selected block diagram and all block diagrams hierarchically under the selected block diagram that executed in said executing; or
block diagrams hierarchically under the selected block diagram that did not execute in said executing; and
storing the graphical code coverage analysis results.

6. The method of claim 1, wherein each node in the plurality of interconnected nodes is configured with:
a flag specifying that the node is to be marked as covered when executed; and
a flag marking the node as covered, wherein the flag marking the node as covered is set
when:
the flag specifying that the node is to be marked as covered when executed is set;
and the node is executed.

7. The method of claim 6, wherein said executing comprises:
for each node that executes,
the node checking its flag specifying that the node is to be marked as covered when executed; and
the node setting its flag marking the node as covered if the flag specifying that the node is to be marked as covered when executed is set.

8. The method of claim 7, wherein said executing further comprises:
for each node that executes, the node clearing its flag specifying that the node is to be marked as covered when executed.

9. The method of claim 6, further comprising:
utilizing the computer to perform:
prior to said executing the graphical program, for each node of at least a subset of the plurality of interconnected nodes, setting the flag specifying that the node is to be marked as covered when executed.

10. The method of claim 6, further comprising:
utilizing the computer to perform:
ceasing generation of the graphical code coverage information by clearing the flag specifying that the node is to be marked as covered when executed for each node in at least a portion of the graphical program.

11. The method of claim 6, further comprising: utilizing the computer to perform:
resetting the graphical code coverage information in the graphical program by clearing the flag marking the node as covered for each node of at least a subset of the plurality of interconnected nodes.

12. The method of claim 11, wherein said resetting the graphical code coverage information in the graphical program comprises:
resetting the graphical code coverage information for all the nodes in a specified sub-block diagram and all block diagrams hierarchically under the specified sub-block diagram; or
resetting the graphical code coverage information for all the nodes in the graphical program.

13. The method of claim 11, wherein said resetting the graphical code coverage information in the graphical program further comprises:
if said resetting is performed during generation of the graphical code coverage information, setting the flag specifying that the node is to be marked as covered when executed for each node of the at least a subset of the plurality of interconnected nodes in the graphical program.

14. The method of claim 1, wherein each block diagram comprises a hidden node that represents the block diagram wherein setting its flag marking the node as covered indicates that the block diagram has been executed, and wherein said executing comprises:
for each block diagram that executes,
the hidden node checking its flag specifying that the node is to be marked as covered when executed; and
the hidden node setting its flag marking the node as covered to indicate that the block diagram has been executed if the flag specifying that the node is to be marked as covered when executed is set.

15. The method of claim 1, wherein the graphical code coverage information comprises one or more of:
execution count per node; or
execution count per diagram.

16. The method of claim 1,
wherein the graphical program comprises a graphical data flow program.

17. A non-transitory computer accessible memory medium that stores program instructions for analyzing a graphical program, wherein the program instructions are executable by a processor to perform:
providing a graphical program, wherein the graphical program comprises a plurality of interconnected nodes that visually indicate functionality of the graphical program, wherein the graphical program is written in a graphical programming language in which each node has at least one associated flag for configuring the node to provide graphical code coverage information without requiring a user to add instrumentation code,
wherein the graphical program comprises a plurality of block diagrams arranged in a hierarchical manner, comprising a top-level block diagram and one or more sub-block diagrams, and wherein each block diagram includes a respective subset of the plurality of interconnected nodes;
wherein at least one of the block diagrams comprises a node that includes at least one of the sub-block diagrams,
wherein when a block diagram executes, all the respective nodes of the block diagram execute, and
wherein each node in the plurality of interconnected nodes is configured to provide graphical code coverage information when executed;
executing the graphical program, wherein said executing generates graphical code coverage information for the graphical program indicating which nodes executed; and
storing the graphical code coverage information.

18. The non-transitory computer accessible memory medium of claim 17, wherein the program instructions are further executable to perform:
automatically analyzing the generated graphical code coverage information to determine graphical code coverage analysis results, comprising one or more of:
fraction of the plurality of nodes of the graphical program that executed in said executing; or
block diagrams that did not execute in said executing; and
storing the graphical code coverage analysis results.

19. The non-transitory computer accessible memory medium of claim 18, wherein the program instructions are further executable to perform:
outputting the graphical code coverage analysis results, comprising one or more of:
generating a report comprising the graphical code coverage analysis results; or
displaying at least a portion of the graphical program, including graphically highlighting the block diagrams that did not execute.

20. The non-transitory computer accessible memory medium of claim 17, wherein each node in the plurality of interconnected nodes is configured with:
a flag specifying that the node is to be marked as covered when executed; and
a flag marking the node as covered, wherein the flag marking the node as covered is set when:
the flag specifying that the node is to be marked as covered when executed is set;
and the node is executed.

21. The non-transitory computer accessible memory medium of claim 17, wherein each block diagram comprises a hidden node that includes respective instances of the flag specifying that the node is to be marked as covered when executed, and the flag marking the node as covered, wherein the hidden node represents the block diagram, wherein setting its flag marking the node as covered indicates that the block diagram has been executed, and wherein said executing comprises:

for each block diagram that executes,
the hidden node checking its flag specifying that the node is to be marked as covered when executed; and
the hidden node setting its flag marking the node as covered to indicate that the block diagram has been executed if the flag specifying that the node is to be marked as covered when executed is set.

22. A system, comprising:
a processor; and
a memory, coupled to the processor, wherein the memory stores program instructions for analyzing a graphical program, wherein the program instructions are executable by the processor to:
provide a graphical program, wherein the graphical program comprises a plurality of interconnected nodes that visually indicate functionality of the graphical program, wherein the graphical program is written in a graphical programming language in which each node has at least one associated flag for configuring the node to provide graphical code coverage information without requiring a user to add instrumentation code, wherein the graphical program comprises a plurality of block diagrams arranged in a hierarchical manner, comprising a top-level block diagram and one or more sub-block diagrams, wherein each block diagram includes a respective subset of the plurality of interconnected nodes;
wherein at least one of the block diagrams comprises a node that includes at least one of the sub-block diagrams,
wherein when a block diagram executes, all the respective nodes of the block diagram execute, and
wherein each node in the plurality of interconnected nodes is configured to provide graphical code coverage information when executed;
execute the graphical program, thereby generating graphical code coverage information for the graphical program indicating which nodes executed; and
store the graphical code coverage information.

23. The system of claim 22, wherein the program instructions are further executable to:
automatically analyze the generated graphical code coverage information to determine graphical code coverage analysis results, comprising one or more of:
fraction of the plurality of nodes of the graphical program that executed in said executing; or
block diagrams that did not execute in said executing; and
store the graphical code coverage analysis results.

24. The system of claim 23, wherein the program instructions are further executable to:
output the graphical code coverage analysis results, wherein to output the graphical code coverage analysis results, the program instructions are executable to:
generate a report comprising the graphical code coverage analysis results; and/or
display at least a portion of the graphical program, including graphically highlighting the block diagrams that did not execute.

25. The system of claim 22, wherein each node in the plurality of interconnected nodes is configured with:
a flag specifying that the node is to be marked as covered when executed; and
a flag marking the node as covered, wherein the flag marking the node as covered is set when:
the flag specifying that the node is to be marked as covered when executed is set;
and the node is executed.

26. The system of claim 22, wherein each block diagram comprises a hidden node that includes respective instances of the flag specifying that the node is to be marked as covered when executed, and the flag marking the node as covered, wherein the hidden node represents the block diagram, wherein setting its flag marking the node as covered indicates that the block diagram has been executed, and wherein to said executing comprises:

for each block diagram that executes,
the hidden node checking its flag specifying that the node is to be marked as covered when executed; and
the hidden node setting its flag marking the node as covered to indicate that the block diagram has been executed if the flag specifying that the node is to be marked as covered when executed is set.

27. The method of claim 1, further comprising:
utilizing the computer to perform:
automatically analyzing the generated graphical code coverage information to determine graphical code coverage analysis results, comprising one or more of:
nodes in the graphical program that executed; or
nodes in the graphical program that did not execute; and
storing the graphical code coverage analysis results.

* * * * *